US008984365B1

United States Patent
Norrie

(10) Patent No.: US 8,984,365 B1
(45) Date of Patent: Mar. 17, 2015

(54) SYSTEM AND METHOD FOR REDUCED MEMORY STORAGE IN LDPC DECODING

(71) Applicant: PMC-Sierra US, Inc., Sunnyvale, CA (US)

(72) Inventor: Christopher I. W. Norrie, San Jose, CA (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 104 days.

(21) Appl. No.: 13/860,300

(22) Filed: Apr. 10, 2013

Related U.S. Application Data

(60) Provisional application No. 61/782,263, filed on Mar. 14, 2013.

(51) Int. Cl.
*H03M 13/00* (2006.01)
*H03M 13/11* (2006.01)

(52) U.S. Cl.
CPC ................................ *H03M 13/1105* (2013.01)
USPC ............................ 714/758; 714/755; 714/792

(58) Field of Classification Search
CPC ............................ H03M 13/09; H04L 1/0061
USPC ..................... 714/758, 755, 796, 792, 718
See application file for complete search history.

(56) References Cited

U.S. PATENT DOCUMENTS

| | | | |
|---|---|---|---|
| 5,732,092 A | 3/1998 | Shinohara | |
| 6,115,788 A | 9/2000 | Thowe | |
| 6,539,515 B1 | 3/2003 | Gong | |
| 6,934,804 B2 | 8/2005 | Hashemi | |
| 6,976,194 B2 | 12/2005 | Cypher | |
| 6,976,197 B2 | 12/2005 | Faust et al. | |
| 7,206,992 B2 | 4/2007 | Xin | |
| 7,237,183 B2 | 6/2007 | Xin | |
| 7,484,158 B2 * | 1/2009 | Sharon et al. | 714/755 |
| 7,937,641 B2 | 5/2011 | Amidi | |
| 7,958,430 B1 | 6/2011 | Kolokowsky et al. | |
| 7,975,193 B2 | 7/2011 | Johnson | |
| 8,140,930 B1 | 3/2012 | Mauro | |
| 8,176,367 B2 | 5/2012 | Dreifus et al. | |
| 8,219,894 B2 | 7/2012 | Au et al. | |
| 8,245,112 B2 | 8/2012 | Hicken et al. | |
| 8,245,117 B1 | 8/2012 | Wu | |
| 8,255,770 B2 | 8/2012 | Park et al. | |
| 8,261,136 B2 | 9/2012 | D'abreu et al. | |
| 8,281,227 B2 | 10/2012 | Thatcher et al. | |
| 8,286,004 B2 | 10/2012 | Williams | |
| 8,307,258 B2 | 11/2012 | Flynn et al. | |
| 8,327,220 B2 | 12/2012 | Borchers et al. | |
| 8,335,977 B2 | 12/2012 | Weingarten et al. | |
| 8,392,789 B2 * | 3/2013 | Biscondi et al. | 714/755 |
| 8,402,201 B2 | 3/2013 | Flynn et al. | |
| 8,418,023 B2 | 4/2013 | Gunnam et al. | |
| 8,429,497 B2 | 4/2013 | Tu et al. | |
| 8,504,887 B1 | 8/2013 | Varnica et al. | |
| 8,555,140 B2 | 10/2013 | Gunnam et al. | |
| 8,621,318 B1 | 12/2013 | Micheloni et al. | |

(Continued)

*Primary Examiner* — Fritz Alphonse
(74) *Attorney, Agent, or Firm* — Kenneth Glass; Molly Sauter; Glass & Associates

(57) ABSTRACT

A low-density parity check (LDPC) decoder is provided that eliminates the need to calculate customized check node codeword estimates by considering the check node processor and the variable node processor as a single processer having a shared memory for storing common variables to be used during both the check node processing and the variable node processing of the iterative decoding method.

21 Claims, 10 Drawing Sheets

(56) References Cited

U.S. PATENT DOCUMENTS

| | | |
|---|---|---|
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 2003/0033567 A1 | 2/2003 | Tamura et al. |
| 2003/0104788 A1 | 6/2003 | Kim |
| 2004/0088636 A1 | 5/2004 | Cypher |
| 2004/0123230 A1 | 6/2004 | Lee et al. |
| 2004/0252791 A1 | 12/2004 | Shen et al. |
| 2005/0248999 A1 | 11/2005 | Tamura et al. |
| 2007/0050688 A1 | 3/2007 | Thayer |
| 2007/0089031 A1 | 4/2007 | Huffman et al. |
| 2008/0005382 A1 | 1/2008 | Mimatsu |
| 2008/0016425 A1 | 1/2008 | Khan et al. |
| 2008/0229079 A1 | 9/2008 | Flynn et al. |
| 2008/0229164 A1 | 9/2008 | Tamura et al. |
| 2008/0256292 A1 | 10/2008 | Flynn et al. |
| 2009/0327802 A1 | 12/2009 | Fukutomi |
| 2010/0199149 A1 | 8/2010 | Weingarten |
| 2010/0211737 A1 | 8/2010 | Flynn et al. |
| 2010/0211852 A1 | 8/2010 | Lee et al. |
| 2010/0246664 A1 | 9/2010 | Citta et al. |
| 2010/0293440 A1 | 11/2010 | Thatcher |
| 2011/0072331 A1 | 3/2011 | Sakaue et al. |
| 2011/0246853 A1 | 10/2011 | Kim |
| 2011/0296084 A1 | 12/2011 | Nango |
| 2012/0051144 A1 | 3/2012 | Weingarten et al. |
| 2012/0054413 A1 | 3/2012 | Brandt |
| 2012/0311402 A1 | 12/2012 | Tseng et al. |
| 2013/0145235 A1 | 6/2013 | Aussien et al. |
| 2013/0163328 A1 | 6/2013 | Karakulak et al. |
| 2014/0053037 A1 | 2/2014 | Wang et al. |
| 2014/0072056 A1 | 3/2014 | Fay |

* cited by examiner

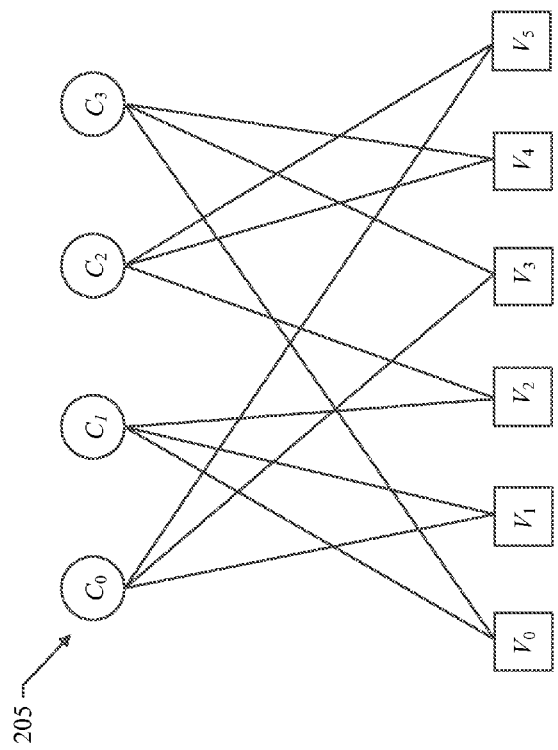

SYSTEM AND METHOD FOR REDUCED MEMORY STORAGE IN LDPC DECODING

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. One commonly employed error correction code employed in nonvolatile memory storage modules, such as SSDs, are low-density parity-check (LDPC) codes. An LDPC code is a linear error correcting code having a parity check matrix with a small number of nonzero elements in each row and column.

Various methods for decoding data encoded with LDPC error correction codes are known in the art, including the sum-product algorithm (SPA) and the min-sum algorithm (MSA). While the sum-product algorithm (SPA) is known to achieve the best decoding performance, it is computationally complex. The min-sum algorithm (MSA) was introduced to reduce the computationally complexity inherent in the sum-product algorithm. Additionally, one commonly employed decoding method for LDPC coding is the layered min-sum algorithm (MSA). The layered min-sum algorithm is iterative by layer of the parity check matrix.

The decoding of LDPC encoded data, when utilizing either the sum-product algorithm or the min-sum algorithm, requires the maintenance and storage of a large amount of data that is iteratively passed between the check nodes and the variable nodes during the decoding process. The memory storage requirements to store the variables, such as random access memory (RAM), may be very large and as such, may require a significant amount of space on the integrated circuit. In addition to the memory storage requirements, the associated logic required for routing the data between the variable nodes and the check nodes and the processing engines of the variable nodes and the check nodes consume valuable space on the integrated circuit device. It desirable to reduce the amount of space required for the memory storage and also to reduce the hardware required for the routing of data between the variable nodes and the check nodes.

Accordingly, what is needed in the art is an improved system and method that reduces the memory storage requirements for iterative decoding methods, such as LDPC decoding.

SUMMARY

In various embodiments, a nonvolatile memory system includes a nonvolatile memory storage module for storing encoded data. The encoded data stored in the nonvolatile memory storage module is encoded using a low-density parity check (LDPC) error correction code. A decoder receives the LDPC encoded data stored in the nonvolatile memory storage module and attempts to decode and recover the data.

A low-density parity check (LDPC) decoder is provided for decoding low-density parity check (LDPC) encoded data that eliminates the need to calculate customized check node codeword estimates by considering the check node processor and the variable node processor as a single processer having a shared memory for storing common variables to be used during both the check node processing and the variable node processing of the iterative decoding method. By reformulating the calculations performed during the check node processing and the variable node processing, the present invention also greatly reduces the number of common processing variables that need to be stored and shared between the variable and check nodes, thereby reducing the memory storage requirements for the LDPC decoder.

In accordance with the present invention, a method for decoding low-density parity check (LDPC) encoded data using a parity check matrix, the parity check matrix to define the connections between a plurality of check nodes and a plurality of variable nodes is provided. The method comprises, performing check node processing at one check node of the plurality of check nodes using a variable node codeword estimate received from each of the plurality of variable nodes connected to the check node to generate a common check node codeword estimate, and sharing the common check node codeword estimate with each of the plurality of variable nodes connected to the one check node, performing variable node processing at one variable node of the plurality of variable nodes after removing a contribution of the one variable node from the common check node codeword estimate to generate an updated variable node codeword estimate, calculating a final codeword estimate and performing a check of the final codeword estimate to determine if the final codeword estimate is a valid codeword and if the final codeword estimate is not determined to be a valid codeword, removing a contribution of the one check node from the updated variable node codeword estimate and repeating the steps of performing check node processing and performing variable node processing until the updated variable node codeword estimate is determined to be a valid codeword or until a maximum number of iterations is reached.

The present invention may be employed in both sum-product algorithms and min-sum approximations.

An LDPC decoder is provided for decoding low-density parity check (LDPC) encoded data, the LDPC encoded data comprising a plurality of log-likelihood ratios (LLRs), each of the plurality of LLRs representing one of a plurality of bits of an LDPC codeword encoded using a parity check matrix. The decoder includes, a check node and variable node processor for performing check node processing at one check node of the plurality of check nodes using a variable node codeword estimate received from each of the plurality of variable nodes connected to the check node to generate a common check node codeword estimate, for sharing the common check node codeword estimate with each of the plurality of variable nodes connected to the one check node and for performing variable node processing at one variable node of the plurality of variable nodes after removing a contribution of the one variable node from the common check node codeword estimate to generate an updated variable node codeword estimate. The decoder further includes a codeword estimate check processor coupled to the check node and variable node processor, the codeword estimate check processor for performing a check of the final codeword estimate to determine if the final codeword estimate is a valid codeword. In the decoder, the check node and variable node processor are used for removing a contribution of the one check node from the updated variable node codeword estimate if the final codeword estimate is not determined to be a valid codeword, and for and repeating the check node processing and variable node processing until the final codeword estimate is determined to be a valid codeword or until a maximum number of iterations is reached.

The present invention provides an improved system and method that reduces the memory storage requirements for iterative decoding methods, such as LDPC decoding.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 2A is an illustration of a parity check matrix of a regular LDPC code.

FIG. 2B is an illustration of a Tanner Graph of the parity check matrix of FIG. 2A.

DETAILED DESCRIPTION

Figure 1:
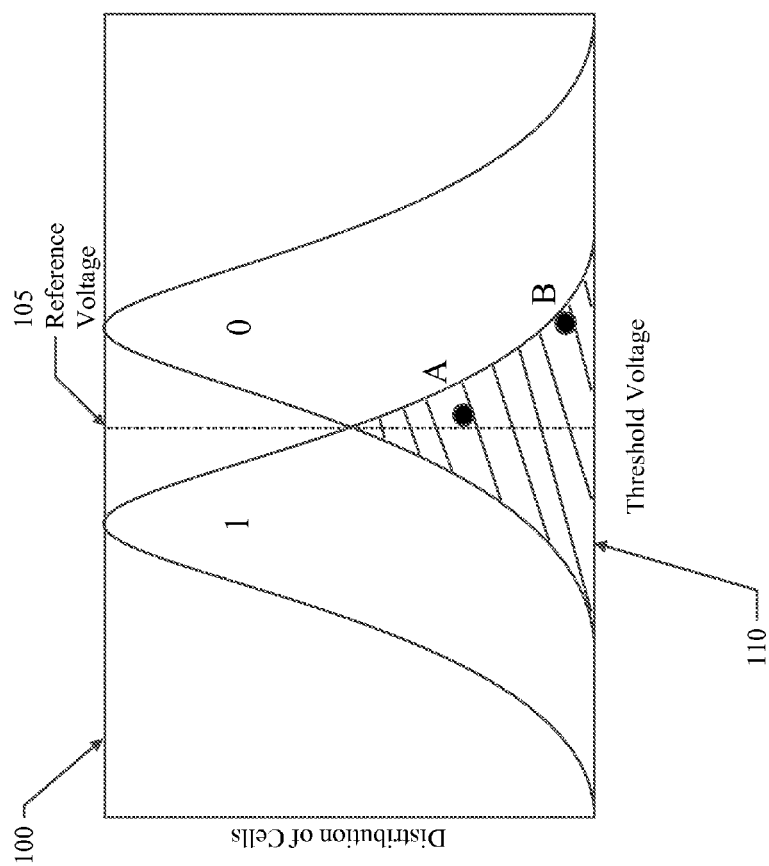
FIG. 1 is graphical illustration of a possible distribution overlap in the two voltage distributions used for decoding.

In the operation of a stored channel utilizing LDPC encoding, original data are stored in a non-volatile memory. Different noise sources estimated as Additive White Gaussian Noise (AWGN) Channel corrupt the original stored message resulting in a one becoming a zero or vice versa. To improve the bit error rate, BER, the SSD write controller may comprise an LDPC encoder which multiplies an information bit vector with a generator matrix G of the LDPC code. The output of the encoder is then stored in a nonvolatile memory system. During the read operation, the nonvolatile memory system provides the stored codewords to an LDPC decoder which performs the LDPC decoding process.

The nonvolatile memory system used in the communication system may be a NAND-based flash memory system. While NAND-based flash memories are reliable, they are not inherently error-free and often rely on error correction coding (ECC) to correct raw bit errors in the stored data. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of parity bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm) is nearing the Shannon Limit of the communication channel. The increased probability of errors in the stored data results in an increase in the error code correction necessary to correct the bit errors in the flash memory. The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

To achieve an acceptable UBER for Enterprise applications employed in a flash storage controller, low-density parity-check (LDPC) error correction coding is commonly used. An LDPC code is a linear error correcting code having a parity check matrix with a small number of nonzero elements in each row and column. LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired.

The power of LDPC codes resides in the ability of the decoding strategy to exploit the soft information of the stored data. In LDPC decoding of single-level (SLC) flash memory, the two voltage distributions represent the two possible states, "0" and "1", of the cells within the NAND chips. When the voltage distributions overlap 110, as shown with reference to the graph 100 of FIG. 1, errors arise. A hard-decision decoder will read all the values to the right of the reference voltage 105 as 0 and all the values to the left of the reference voltage 105 as 1. So, in the situation depicted in the graph 100, the overlap region 110 will be composed of read errors. However, observing error points A and B within the overlap region 110, it is clear that the error points may vary in magnitude. The farther away the error points are from the reference voltage 105, the more probable it is that the cell contains the value that was stored. For example, point A is slightly to the right of the reference voltage and as such, slightly positive, while point B is farther away from the reference voltage 105. As such, it is more likely that point A carries the greater error because correct values should not be close to the reference voltage. Alternatively, point B is considered to carry less error than point A and is more likely to be read correctly. By exploiting the exact value of point A and point B, differentiation can be used between the two points and better information can then be provided to the decoder, resulting in improved decoding performance of the decoder in decoding the LDPC encoded codewords. Estimations of the exact value of point A and point B are referred to as soft information, which may be expressed by a log-likelihood ratio (LLR). As such, in FIG. 1, error point A would be presented to the LDPC decoder as a value of zero and assigned a low magnitude LLR (probability) due to its close proximity to the reference voltage 105, whereas error point B would be presented to the LDPC decoder as a value of zero and assigned a moderate magnitude LLR (probability) due to its greater distance from the reference voltage 105. The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. In the case of a NAND chip exhibiting a low noise case, a corresponding low raw bit error rate (RBER) will exist wherein most LLRs will have a large magnitude, while only a few LLRs will have a small magnitude.

LDPC decoding is performed based upon a parity check matrix which consists of "0"'s and "1"'s that define the parity check equations. An MxN parity check matrix (H) comprises M rows and N columns. The number of columns N corresponds to the number N of codeword bits within one encoded codeword and the codeword comprises a plurality of information bits (K) and M parity check bits. The number of rows within the parity check matrix corresponds to the number M of parity check bits in the codeword.

The decoding of the LDPC codes is an iterative process that uses as input, the LLR of the received data bits in the codeword, as in the equation:

$$LLR(x) = \log\left[\frac{p(x \mid y = 0)}{p(x \mid y = 1)}\right]$$

where "x" is the read message and "y" is the original codeword. As such, the LLR for a particular read value of "y" is the logarithmic ratio between the probability that the bit of the original codeword "x" was a 0 given the read value "y" and the probability that the bit "x" was a 1 given the read value "y". As such, the magnitudes of the LLRs measure the probability that the bit is read correctly vs. the probability that the bit is read incorrectly. When performing decoding of the codeword, the LLRs are propagated and updated between the variable nodes and the check nodes in a Tanner graph, which is representative of the parity check matrix of the LDPC code.

With reference to FIG. 2, it is useful to think of the parity check matrix 200 used for LDPC decoding in terms of its equivalent Tanner graph 205. A Tanner graph is a bipartite graph used to state constraints or equations which specify error correcting codes. In a Tanner graph representative of the parity check matrix, there are M=N−K check nodes C, one check node for each check equation, and N variable nodes, one variable node for each codeword bit. During the decoding process, the M check nodes and N variable nodes iteratively exchange information between themselves according to the LDPC decoding algorithm. The "1"'s in the parity check matrix determine the connections between the check nodes and the variable nodes. Iterative information exchange is performed only between the check nodes and the variable nodes that are connected to each other as defined in the parity check matrix.

Figure 3B:
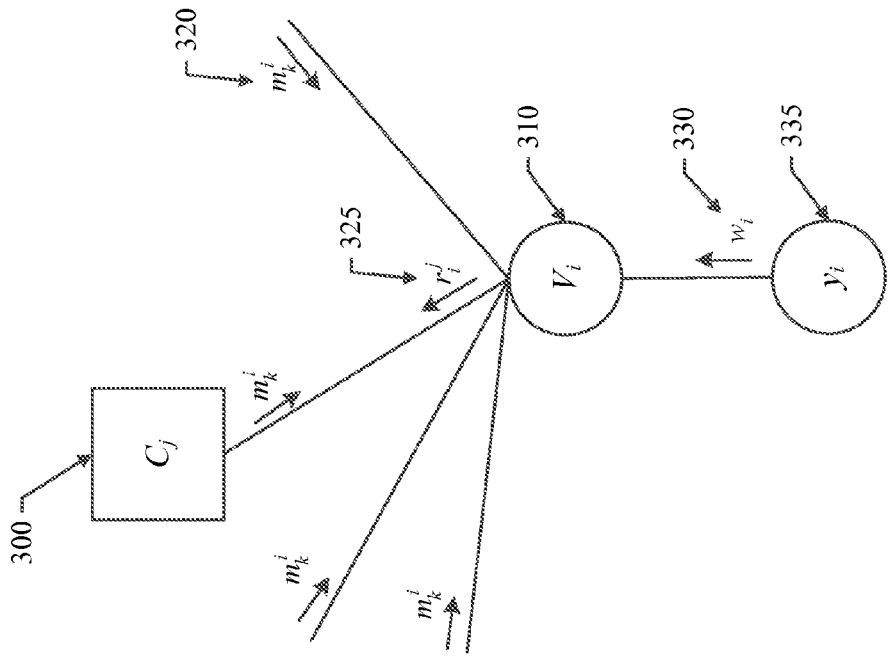
FIG. 3B is a diagram illustrating variable node processing within an LDPC parity check matrix.
Figure 3A:
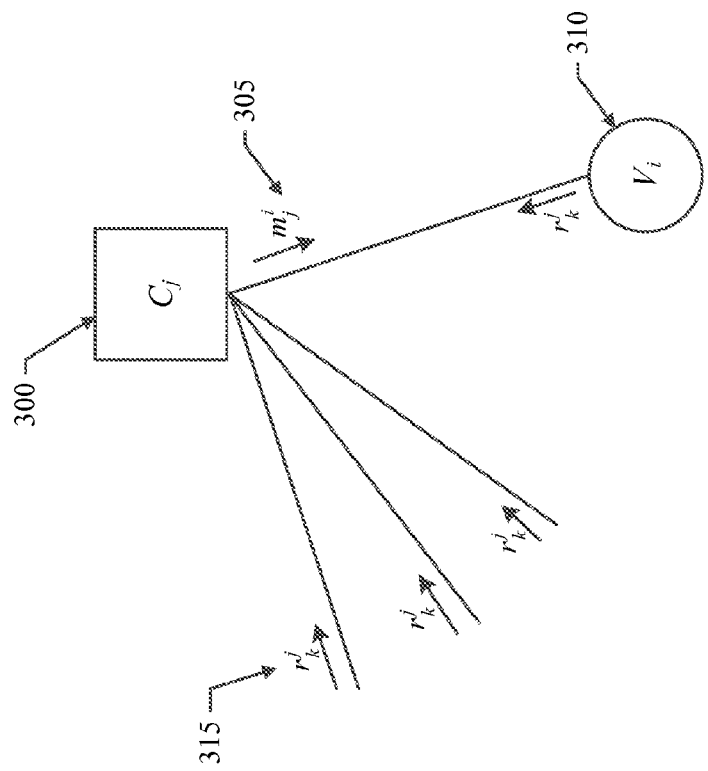
FIG. 3A is a diagram illustrating check node processing within an LDPC parity check matrix.

With reference to FIG. 3, in the processing phase of the decoding as illustrated in FIG. 3A, each check node ($C_j$) 300 computes values ($m_j^i$) 305 to be sent to the variable nodes ($V_i$) 310 to which the check node 300 is connected as defined by the parity check matrix. Each time the check node 300 computes the value 305, only extrinsic information is taken into account. In other words, the value $m_i$ is computed using all the values sent by the variable nodes connected to that check node $r_k^j$ 315, except variable node i, according to the following formulas:

$$m_j^i = \prod_{k \in N(j) \setminus i} \text{sign}(r_k^j) \cdot \phi\left(\sum_{k \in N(j) \setminus i} \phi(|r_k^j|)\right)$$

$$\phi(x) = -\log\left(\tanh\left(\frac{x}{2}\right)\right)$$

A similar concept is applied to variable node processing in accordance with the parity check matrix as shown with reference to FIG. 3B. In variable node processing, the value $r_j$ 325, representing the codeword estimate, is computed using all the values $m_k^i$ 320 sent by the check nodes connected to the variable node 310, except check node j 300 and the input LLRs $w_i$ 330 read from the NAND cells 335, according to the following formula:

$$r_j^i = w_i + \sum_{k \in N(i) \setminus j} m_k^i$$

Following every iteration of the check node processing and variable node processing steps, the codeword estimates from all the check nodes connected to the variable node are summed to along with the input LLRs $w_i$ to generate a final codeword estimate and the final codeword estimate is checked to determine if the final codeword estimate is a valid codeword by multiplying it by the transpose of the parity check matrix (H). If the result is null, then the final codeword estimate is a considered a valid codeword and the decoding is complete. If the result is not null, then the decoding is not considered complete and a new iteration is started.

The message passing computation rule procedure as described above is referred to as a belief propagation (BP) computation rule and is also commonly known as the sum-product algorithm (SPA). While the sum-product algorithm is known to achieve the best decoding performance, it is computationally complex. The formula used in check node processing following the sum-product algorithm is a very complex formula involving both the tan h and the log function which are difficult to implement in hardware necessary to compute the check node formula. The computational complexity of the SPA necessitates a decoding device having a large number of logic gates, resulting in an increased cost and decreased power efficiency of the device. Typically, the results of the SPA computation are calculated and stored in a phi ($\phi$)-function look-up table that is accessed during the iterative decoding process.

In the sum-product algorithm, the $\phi$ function produces a very large result for small values of x (read messages) and a very small result for large values of x (read messages). In general, as x approaches zero, $\phi(x)$ approaches infinity and as x increases from zero, $\phi(x)$ rapidly decreases in value.

When a check node receives the extrinsic information it operates on, the majority of the information will have originated from reasonably reliable sources, because most of the variable nodes associated with the check node will have large LLR magnitudes, representing a high probability that the message read from the memory is the original codeword that was stored. When only a small amount of noise has affected the stored bits, and as such the raw bit error rate (RBER) is low, the majority of LLRs will tend to have a large magnitude, while only a few LLRs will have a small magnitude. For example, at a raw bit error rate (RBER) of 1 e-3, an average of only 1 in 1000 bits is in error. As such, all the extrinsic information operated on by the check nodes will have large LLR magnitudes except for the check nodes that process bits that are in error. However, even in the case where the check node is processing bits that are in error, it is likely that only 1 of the extrinsic sources for that particular check node has a small LLR magnitude. The small LLR magnitude of that one extrinsic source will have the greatest effect on the $\phi$ function, as previously discussed. As a result of the complexity of the sum-product algorithm, and the assumption that the smallest extrinsic value approximates all extrinsic values received by a check node, approximated decoders utilizing a min-sum algorithm (MSA) have been developed where the $\phi$ function is computed as a minimum among the magnitudes of a set of values according to the formula:

$$m^i_j = \prod_{k \in N(j)\setminus\{i\}} \text{sign}(r^j_k) \cdot \min_{k \in N(j)\setminus\{i\}} |r^j_k|$$

However, since utilizing this formula yields an approximation to the full sum-product algorithm (SPA), an attenuation, or normalization, factor (a) is introduced into the MSA computation as:

$$m^i_j = \alpha \cdot \prod_{k \in N(j)\setminus\{i\}} \text{sign}(r^j_k) \cdot \min_{k \in N(j)\setminus\{i\}} |r^j_k|$$

In the normalized min-sum algorithm, the complicated computation of the tan h function and the log function are replaced with a simple minimum value finding operation at the cost of decoding performance. The loss of decoding performance is then recovered by applying a normalizing factor or attenuation factor to the check node processing outputs to improve the error performance.

For example, assuming a typical low noise situation wherein one small magnitude LLR and three larger magnitude LLRs are received as a series of four extrinsics as 0.1, 3, 3 and 3. The associated $\phi(x)$ for these received extrinsics would be 3.00, 0.01, 0.01 and 0.01, respectively, then the sum of the $\phi$ values for these extrinsics would be equal to 3.03 and the $\phi$ of the sum would be equal to about 0.1. The min-sum estimate would also result in a value of 0.1 by ignoring the last three LLRs (3, 3, 3) and considering only the first LLR (0.1). As such, in a low noise situation the assumption can be made that the smallest extrinsic value approximates all extrinsic values received by a check node and the min-sum algorithm will provide a close approximation without requiring any additional attenuation. In general, very little attenuation is required in a low noise situation.

In contrast, in a higher noise situation wherein a series of four received extrinsics are 0.1, 1, 1 and 1, the sum of the $\phi$ of the received extrinsics is 3+(3*.77)=5.3 and $\phi(5.3)$ is equal to 0.01, the output of the check node processing utilizing SPA would be 0.01. However, utilizing the min-sum approximation, the output of the check node processing would be equal to 0.1, which is not a close approximation to the SPA result. As such, in a higher noise situation, the min-sum result will require greater attenuation to more closely approximate the SPA result. In general, attenuating the min-sum result when there is more noise tends to increase the accuracy of the approximation towards the correct check node result.

While in the case of low RBER the min-sum approximation closely approximates the sum-product algorithm (SPA), in the case of high RBER, the approximation may not resemble the sum-product algorithm because the assumption that only 1 extrinsic is small may not be accurate. As such, in the case of high RBER, the min-sum check node calculation may be a poor approximation to the real $\phi$ function result of the sum-product algorithm (SPA). In the case of high RBER, the full min-sum check node calculation will generate a result that is noticeably larger than the sum of $\phi$ result of the sum-product algorithm, which translates to a higher than optimal estimate of the likelihood of which bits are in error versus which are not in error. As such, at high RBER the min-sum calculation tends to be overly optimistic when compared to the sum-product calculation.

The decoding of LDPC encoded data, when utilizing either the sum-product algorithm or the min-sum algorithm, requires the maintenance and storage of a large amount of data that is iteratively passed between the check nodes and the variable nodes during the decoding process. The memory storage requirements to store the variables, such as random access memory (RAM), may be very large and as such, may require a significant amount of space on the integrated circuit. In addition to the memory storage requirements, the associated logic required for routing the data between the variable nodes and the check nodes and the processing engines of the variable nodes and the check nodes consumes valuable space on the integrated circuit device. Therefore, it is desirable to reduce the amount of space required for the memory storage and also to reduce the hardware required for the routing of data between the variable nodes and the check nodes.

In the min-sum calculation previously described, for every check node, the message value $m_i$ is computed using all the values sent by the variable nodes connected to that check node $r^j_k$ 315, except variable node i, according to the formula:

$$m^i_j = \prod_{k \in N(j)\setminus\{i\}} \text{sign}(r^j_k) \cdot \min_{k \in N(j)\setminus\{i\}} |r^j_k|$$

As shown in FIG. 3A, the check node $C_j$ receives variable node codeword estimates as LLRs $r^j_k$ 315 from every variable node to which it is connected as determined by the parity check matrix. The estimate from variable node $V_i$ is then excluded from the calculation of the check node codeword estimate to be returned to variable node $V_i$ that is performed by the check node $C_j$ during each iteration. The exclusion of the estimate from variable node $V_i$ from the check node codeword estimation calculation is evident in the min-sum equation for the check node, wherein $k \in N(j) \backslash \{i\}$, represents exclusion of the $r_k^j$ value from variable node $V_i$ from the set. As such, all the $r_k^j$ values from each of the variable nodes connected to the check node $C_j$ are used in the calculation of the check node codeword estimate $m_i$, with the exception of the $r_k^j$ value from the variable node $V_i$, which is the variable node to receive the check node codeword estimate $m_i$ 305 from the check node $C_j$.

Additionally, for every variable node, the variable node codeword estimate $r_j$ is computed using all the values sent by the check nodes connected to that variable node $m_k^i$ 320, except check node j, according to the formula:

$$r_j^i = w_i + \sum_{k \in N(i) \backslash \{j\}} m_k^i$$

As shown with reference to FIG. 3B, the variable node $V_i$ 310 receives check node codeword estimates $m_k^i$ 320 from every check node to which it is connected as determined by the parity check matrix. The check node codeword estimate from check node $C_j$ is then excluded from the calculation of the variable node codeword estimate to be returned to check node $C_j$, that is performed by the variable node $V_i$. The exclusion of the check node codeword estimate from node $C_j$, from the calculation of the variable node codeword estimate is evident in the formula for the variable node, wherein $k \in N(i) \backslash \{j\}$, represents exclusion of the $m_k^i$ value from check node C from the set. As such, all the $m_k^i$ values from each of the check nodes connected to the variable node $V_i$ are used in the calculation of the variable node codeword estimate $r_j$, with the exception of the $m_k^i$ value from the check node $C_j$, which is the check node to receive the variable node codeword estimate $r_j$ 320 from the variable node $V_i$ 310.

In the prior art implementation of the iterative decoding process, each check node codeword estimate calculated by the check nodes is customized for each individual variable node by excluding the information provided by that individual variable node. As a result of the customization of the messages for each of the check nodes and variable nodes, the variable nodes must store each of the check node codeword estimates received from each of the connected check nodes so that the check node codeword estimates can be used in the calculation of the next variable node codeword estimate to be sent to each of the connected check nodes. As a result of the architecture of the LDPC parity check matrix, there are many more variable nodes than check nodes, as such, a large amount of memory is required for the variable nodes to store all of the customized check node codeword estimates. In an exemplary embodiment, for a H matrix having 2048 check nodes and 36,352 variable nodes to encode 4,544 bytes of encoded data with 256 bytes of parity, every check node will be connected to 71 variable nodes and every variable node will be connected to 4 check nodes. In this exemplary embodiment, the prior art would require the retention of 145,408 (4×4,544) check node codeword estimates for every variable node. It is desirable to reduce the memory requirements of the prior art iterative decoder, thereby reducing the size and the cost of the hardware implementation of the LDPC decoder.

The present invention provides an iterative decoding method that eliminates the need to calculate customized check node codeword estimates by considering the check node processor and the variable node processor as a single processer having a shared memory for storing common variables to be used during both the check node processing and the variable node processing of the iterative decoding method. By reformulating the calculations performed during the check node processing and the variable node processing, the present invention also greatly reduces the number of common processing variables that need to be stored and shared between the variable and check nodes, thereby reducing the memory storage requirements for the LDPC iterative decoder.

The combined check node and variable node processor of the present invention may be used to improve the performance of the LDPC decoder in decoding LDPC encoded data that is stored in a nonvolatile memory system. As shown with reference to FIG. 4, a nonvolatile memory system 400, such as a solid state drive, may include a nonvolatile storage module 415 and a nonvolatile memory controller 405. The nonvolatile memory storage module 415 may comprise a plurality of NAND chips 430. Each of the plurality of NAND chips 430 may be coupled to the nonvolatile memory controller 405 through a plurality of channels 420. In this embodiment, the NAND chips 430 store the encoded codewords and the memory controller 405 is designed to execute reading and writing controls for the NAND chips 430 according to reading and writing instructions received from an access device.

Figure 4:
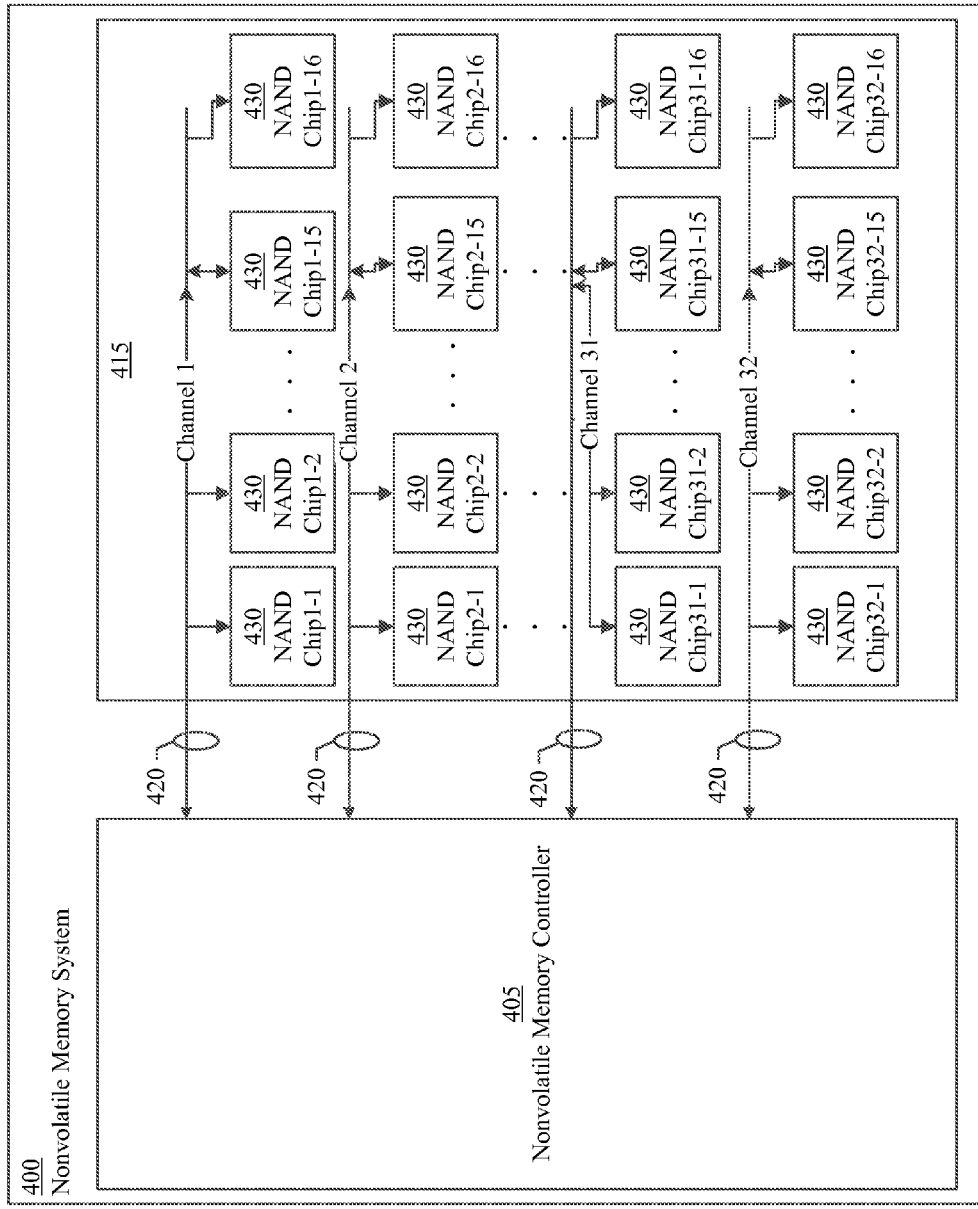
FIG. 4 is a block diagram illustrating a nonvolatile memory system.
Figure 5:
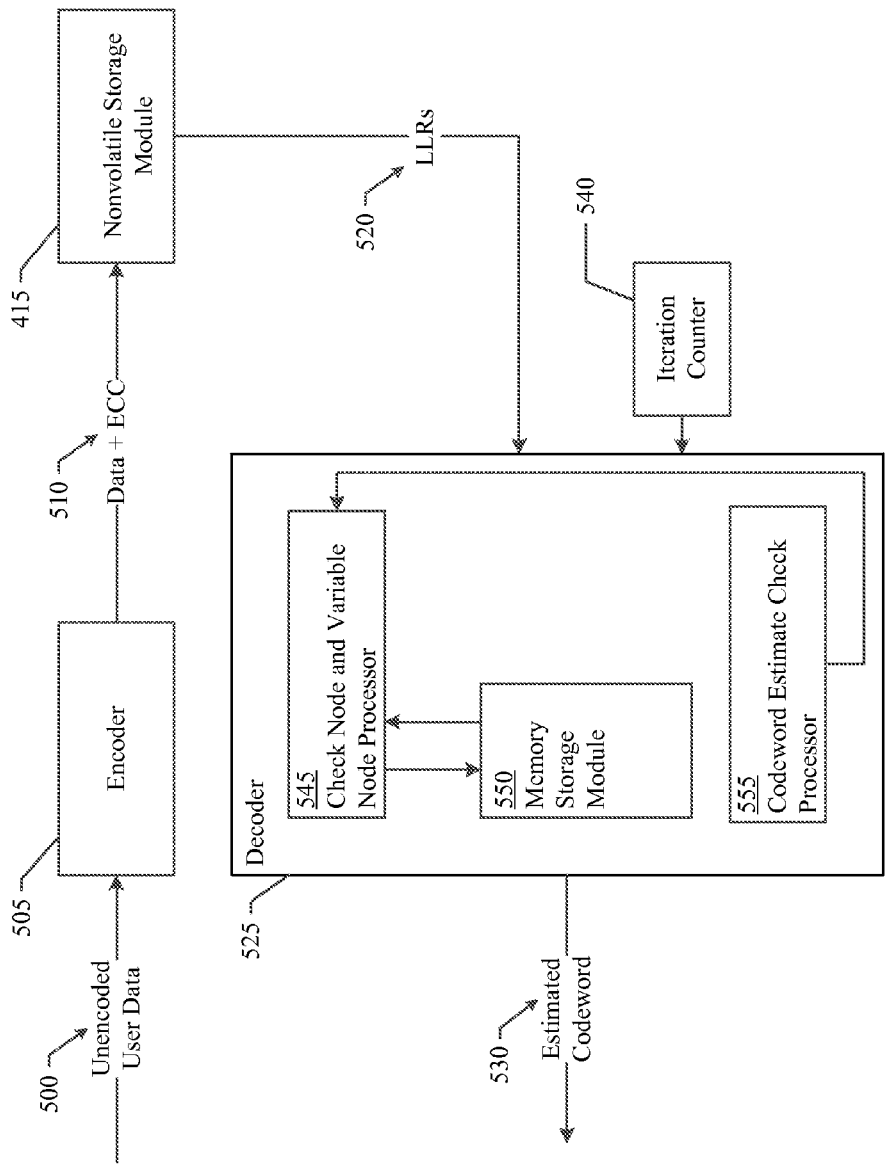
FIG. 5 is a block diagram illustrating LDPC encoding and LDPC decoding in accordance with an embodiment of the present invention.

The nonvolatile storage module 415 of FIG. 4 may be incorporated into a LDPC system as shown with reference to FIG. 5. As shown, the LDPC system may comprise an encoder 505 that is responsible for adding the parity bits to the unencoded user data 500 in accordance with a low-density parity check (LDPC) code. The LDPC encoded data 510, which includes the unencoded user data 500 and an error correction code, may then be stored as encoded codewords in the nonvolatile storage module 415. In a particular embodiment the nonvolatile memory storage module 415 may include a plurality of NAND chips 430.

In a general operation of the present invention, during a read operation of the nonvolatile storage module 415, multiple reads of the stored codewords may be executed to provide soft information represented by LLRs 520 as previously described. The LLRs 520 are used as input to the LDPC decoder 525 and will be used to decode the unencoded user data 500 encoded by the LDPC encoder 505. The LLRs 520 received at the check node and variable node processor 545 of the LDPC decoder 525 are taken as the initial variable node codeword estimates for the first iteration of the decoding process. In the present invention, the check node processor and the variable node processor of the prior art are combined into a check node and variable node processor 545 to perform both the variable node processing and the check node processing of the decoder 525 in a single processor. A nonvolatile memory system 400 may include the memory storage module 415 and a nonvolatile memory controller 405 as previously described with reference to FIG. 4. In a specific embodiment, the nonvolatile memory controller 405 may include the encoder 505 and the decoder 525.

A memory storage module 550 of the decoder is coupled to the check node and variable node processor 545 to allow variables to be stored and shared between the check nodes and the variable nodes of the check node and variable node processor 545. Typically, the decoder 525 will operate on a submatrix of the parity check matrix, thereby allowing the decoder 525 to perform decoding in parallel in order to improve the performance of the decoder. Additionally, the processing of large matrices, which are commonly employed in decoding technology, is more efficiently performed by dividing the large matrix into a plurality of submatrices. The submatrix comprises a subset of check node processors working with a subset of variable node processors. The subsets are changed during the decoding process such that the entire parity check matrix is covered by a submatrix. In the present invention, the check node processors and the variable node processors of a subset operate as a check node and variable node processor 545 to decode the encoded codeword.

Figure 6:
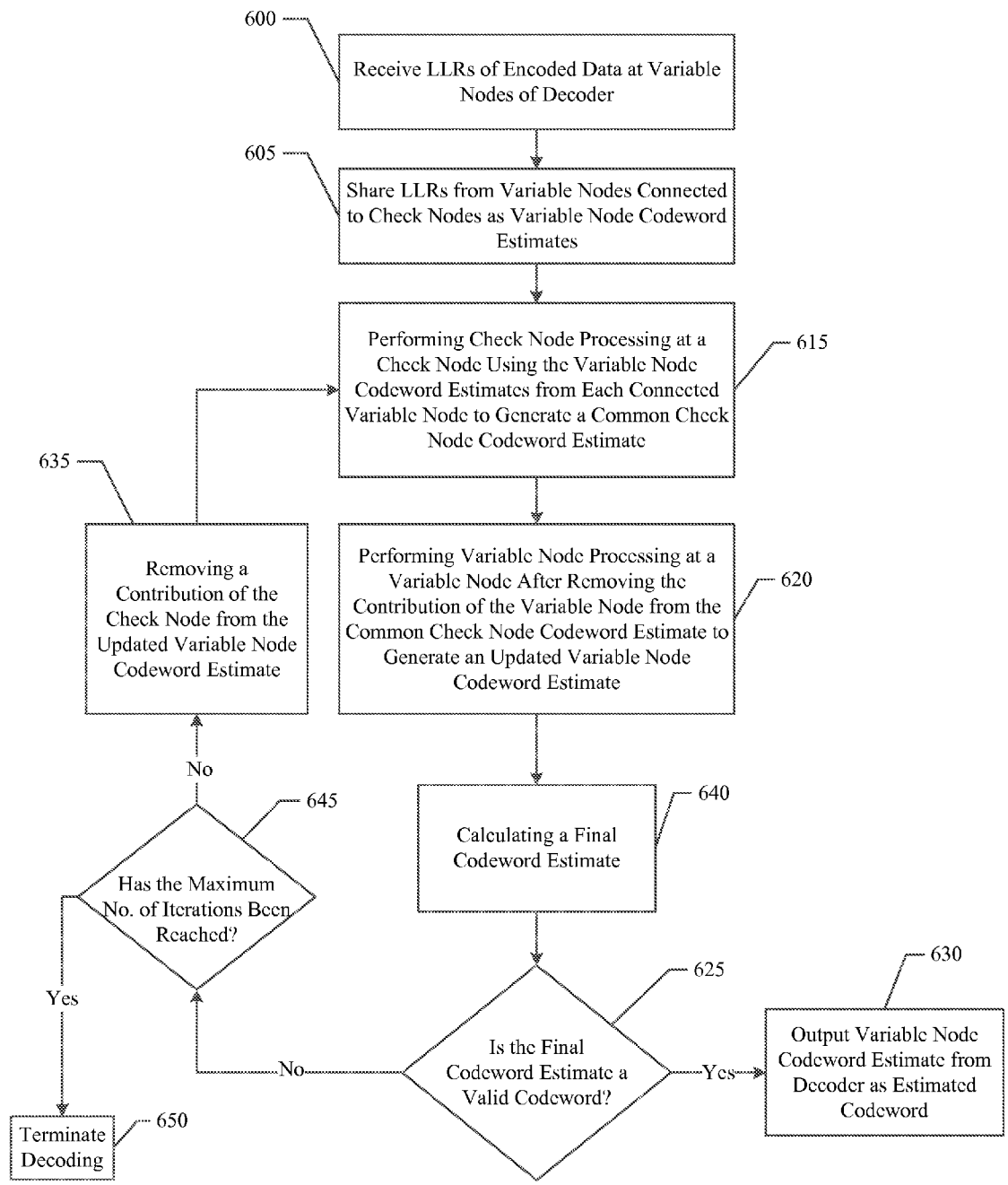
FIG. 6 is a flow diagram illustrating the LDPC decoding method in accordance with an embodiment of the present invention.

With reference to FIG. 6, in operation of the check node and variable node processor 545 in decoding a submatrix of the parity check matrix, to initiate the decoding processing, the variable nodes of the check node of the check node and variable node processor 545 receives the LLRs of the encoded data 600 and shares the LLRs with the check nodes connected to the variable nodes as variable node codeword estimates 605. In a first iteration, the check node performs check node processing using the variable node codeword estimates from each of the variable nodes to which it is connected to generate a common check node codeword estimate 615. This common check node codeword estimate includes input from all the variable node codeword estimates and is not unique to a given variable node. In contrast with the prior art method, which sends a unique check node codeword estimate to each of the variable nodes to which it is connected which excludes the variable node codeword estimate provided by the variable node receiving the unique check node codeword estimate, the present invention generates a common check node codeword estimate that is inclusive of all the variable node codeword estimates received at the check node. The common check node codeword estimate is then shared with all the variable nodes to which the check node is connected.

When a particular variable node receives the common check node codeword estimate, the variable node must remove its contribution to the common check node codeword estimate prior to updating its codeword estimate. After the variable node has removed its contribution to the common check node codeword estimate, variable node processing is performed to generate an updated variable node codeword estimate 620. The updated variable node codeword estimate is then sent to the check nodes to which it is connected. A final codeword estimate is then calculated 640 which includes the common check node codeword estimates from all the check nodes connected to the variable node and the original LLR of the encoded data. The final codeword estimate is then checked by a codeword estimate check processor 555, to verify whether or not the final codeword estimate is a valid codeword 625. In a particular embodiment, the final codeword estimate may be multiplied by the parity check matrix to determine the syndrome and if the syndrome is zero, it may be determined that the final codeword estimate is a valid codeword. If the final codeword estimate is determined to be a valid codeword, the decoding is complete and the estimated codeword is provided as output 630 from the decoder 525. If it is determined by the codeword estimate check processor 555 that the final codeword estimate is not a valid codeword, and the maximum number of iterations of the decoding process has not been reached 645, a second iteration of the decoding begins. In preparation for the second iteration, for a particular check node the contribution of the particular check node to the updated variable node codeword estimate must be removed from the updated variable node codeword estimate prior to sharing the updated codeword estimate with the particular check node 635. The contribution of the particular check node to the updated variable node codeword estimate is removed by the check node and variable node processor 545. The check node processing 615 and variable node processing 620 will continue to be performed for each iteration until the final codeword estimate is determined to be a valid codeword or until a maximum number of iterations is reached 645. The iteration counter 540 may be used to track the number of iterations of the decoding process and may cause the decoding to terminate 650 if a maximum number of iterations is reached 645.

As a result of the reformulation of the check node processing and variable node processing formulas to enable a single check node and variable node processor 545, the memory storage requirements of the LDPC decoder 525 can be reduced. As previously described, in an exemplary embodiment, for a H matrix having 2048 check nodes and 36,352 variable nodes to encode 4,544 bytes of encoded data with 256 bytes of parity, every check node will be connected to 71 variable nodes and every variable node will be connected to 4 check nodes. In this exemplary embodiment, the prior art would require the retention of 145,408 (4×4,544) check node codeword estimates for every variable node. However, in the present invention the need to retain the 145,408 (4×4,544) check node codeword estimates for every variable node has been eliminated and replaced by the use of a common check node codeword estimate stored in a memory storage module 550 that is accessible to the check node and variable node processor.

In a specific embodiment of the present invention, a min-sum approximation may be used to generate the common check node codeword estimate. In operation of the decoding processing utilizing the min-sum approximation, during a read operation of the nonvolatile storage module 415, multiple reads of the stored codewords may be executed to provide soft information represented by LLRs 520 as previously described. The LLRs 520 are used as input to the LDPC decoder 525 and will be used to decode the unencoded user data 500 encoded by the LDPC encoder 505. The LLRs 520 received at the check node and variable node processor 545 of the LDPC decoder 525 are taken as the initial variable node codeword estimates for the first iteration of the decoding process. In the present invention, the check node processor and the variable node processor of the prior art are combined into a check node and variable node processor 545 to perform both the variable node processing and the check node processing of the decoder 525 in a single processor. By using a single processor instead of a separate check node processor and a separate variable node processor, the routing requirements between the two processors can be eliminated. Additionally, combining the check node processor and the variable node processor allows them to share resources, such as summing logic and subtracting logic used to update the codeword estimates. A memory storage module 550 of the decoder is coupled to the check node and variable node processor 545 to allow variables to be stored and shared between the check nodes and the variable nodes of the check node and variable node processor 545. Typically, the decoder 525 will operate on a submatrix of the parity check matrix, thereby allowing the decoder 525 to perform decoding in parallel in order to improve the performance of the decoder. The submatrix comprises a subset of check node processors working with a subset of variable node processors. The subsets are changed during the decoding process such that the entire parity check matrix is covered by a submatrix. Additionally, the processing of large matrices, which are commonly employed in decoding technology, is more efficiently performed by dividing the large matrix into a plurality submatrices. In the present invention, the check node processors and the variable node processors of a subset operate as a check node and variable node processor 545 to decode the encoded codeword.

Figure 7:
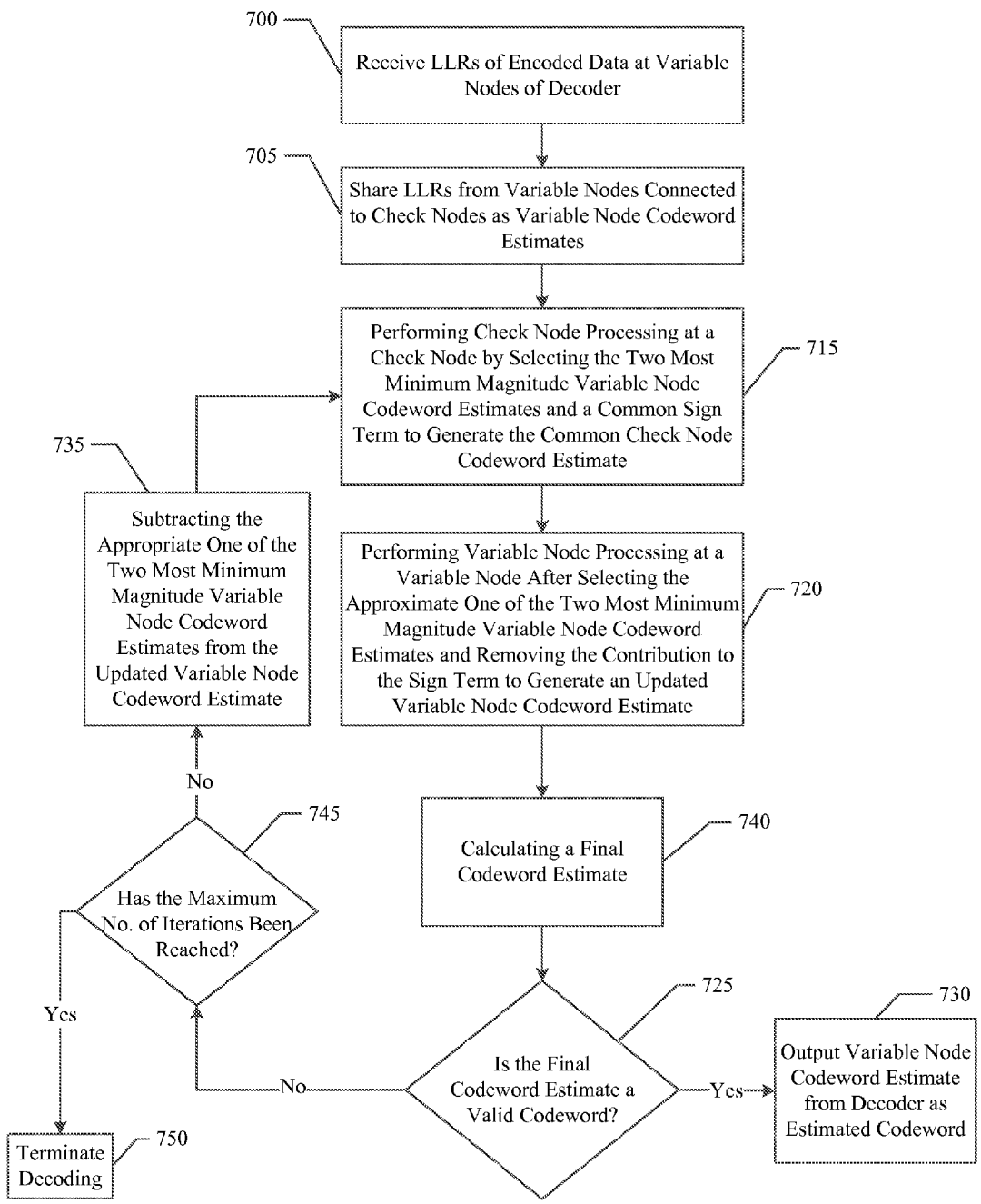
FIG. 7 is a flow diagram illustrating the min-sum LDPC decoding method in accordance with an embodiment of the present invention.

With reference to FIG. 7, in operation of the check node and variable node processor 545 in decoding a submatrix of the parity check matrix, to initiate the decoding processing, the variable nodes of the check node of the check node and variable node processor 545 receives the LLRs of the encoded data 700 and shares the LLRs with the check nodes connected to the variable nodes as variable node codeword estimates 705. In a first iteration, the check node performs check node processing using the variable node codeword estimates from each of the variable nodes to which it is connected to generate a common check node codeword estimate. However, in generating the common check node codeword estimate for the min-sum approximation case, the check node selects the two most minimum magnitude variable node codewords from the variable node codeword estimates received from each of the plurality of variable nodes. Because the min-sum equation for the check node also requires a sign term, the check node also calculates a common sign term calculated from the signs of the variable node codeword estimates received from each of the plurality of variable nodes connected to the check node. As such, in the min-sum case, the check node selects the two most minimum magnitude variable node codeword estimates and a calculated common sign term 715 to be shared with the variable nodes to which the check node is connected.

When a particular variable node receives the two most minimum magnitude variable node codeword estimates from the check node, the variable node must remove its contribution to the common check node codeword estimate prior to updating its codeword estimate. Knowing which variable node codeword estimate the variable node sent to the check node, the variable node can remove its contribution, by determining if the variable node originally sent either of the two most minimum magnitude variable node codeword estimates to the check node. For example, if the first most minimum magnitude variable node codeword estimate is equal to the variable node codeword estimate previously sent to the check node from this variable node, then the variable node selected the second most minimum magnitude variable node codeword estimate to generate an updated variable node codeword estimate.

In addition to identifying the two most minimum magnitude variable node codeword estimates, the min-sum formulas of the check node also calculates a sign term as the product of all the sign terms of the received variable node codeword estimates. In the present invention, the sign term is formed by a summation of the signs of all the received variable node codeword estimates, and as such is referred to as a common sign term. The check node also shares the common sign term with each of the variable nodes and the variable node must remove its contribution to the common sign term. The common sign term calculated by the check node will be negative if all the variable node codeword estimates had an odd number of negative numbers, otherwise the common sign term calculated by the check node will be positive. Each variable node knows the sign of the variable node codeword estimate that it sent to the check node, so the variable node can remove out its contribution to the common sign term by dividing the common sign term by the original sign term the variable node sent to the check node. For example, if the sign term of the variable node codeword estimate was negative, dividing the common sign term by the sign term of the variable node codeword estimate to remove the sign term of the variable node codeword estimate from the common sign term will invert the sign of the common sign term. Alternatively, if the common sign term is positive, dividing the common sign term by the sign term of the variable node codeword estimate to remove the sign term of the variable node codeword estimate from the common sign term will not change the sign of the common sign term.

After the variable node has removed its contribution to the common check node codeword estimate, by selecting the appropriate one of the two most minimum variable node codeword estimates and adjusting the common sign term, variable node processing is performed to generate an updated variable node codeword estimate 720. The updated variable node codeword estimated is generated by calculating the sum of the variable node codeword estimate previously sent to the check nodes and the appropriate most minimum magnitude variable node codeword estimate from the connected check nodes. The updated variable node codeword estimate is then sent to the check nodes to which it is connected. A final codeword estimate is then calculated 740 which includes the common check node codeword estimates from all the check nodes connected to the variable node and the original LLR of the encoded data. The final codeword estimate is then checked by a codeword estimate check processor 555, to verify whether or not the final codeword estimate is a valid codeword 725. In a particular embodiment, the final codeword estimate may be multiplied by the parity check matrix to determine the syndrome and if the syndrome is zero, it may be determined that the final codeword estimate is a valid codeword. If the final codeword estimate is determined to be a valid codeword, the decoding is complete and the estimated codeword is provided as output 730 from the decoder 525. If it is determined by the codeword estimate check processor 555 that the final codeword estimate is not a valid codeword, and the maximum of iterations of the decoding process has not been reached 745, a second iteration of the decoding begins. In preparation for the second iteration, for a particular check node the contribution of the particular check node to the updated variable node codeword estimate must be removed from the updated variable node codeword estimate prior to sharing the updated codeword estimate with the particular check node. In the min-sum approximation, the variable node subtracts the selected one most minimum magnitude variable node codeword estimate from the updated variable node codeword estimate 735, and shares the result with the check node that provided the two most minimum magnitude variable node codeword estimates to the variable node. The check node processing 715 and variable node processing 720 will continue to be performed for each iteration until the final codeword estimate is determined to be a valid codeword or until a maximum number of iterations is reached 745. The iteration counter 540 may be used to track the number of iterations of the decoding process and may cause the decoding to terminate 750 if a maximum number of iterations is reached 745.

In the min-sum approximation of the present invention, it is only necessary for the memory storage module 550 to store the two most minimum magnitude variable node codeword estimates for each of the check nodes, a 1-bit sign term for the check node codeword estimates and a 1-bit select control identifying which of the two most minimum magnitudes was selected by each of the variable nodes. As such, the memory storage requirements are greatly reduced by the min-sum approximation by eliminating the prior art requirement of storing the one most minimum magnitude estimate for every variable node.

Figure 8:
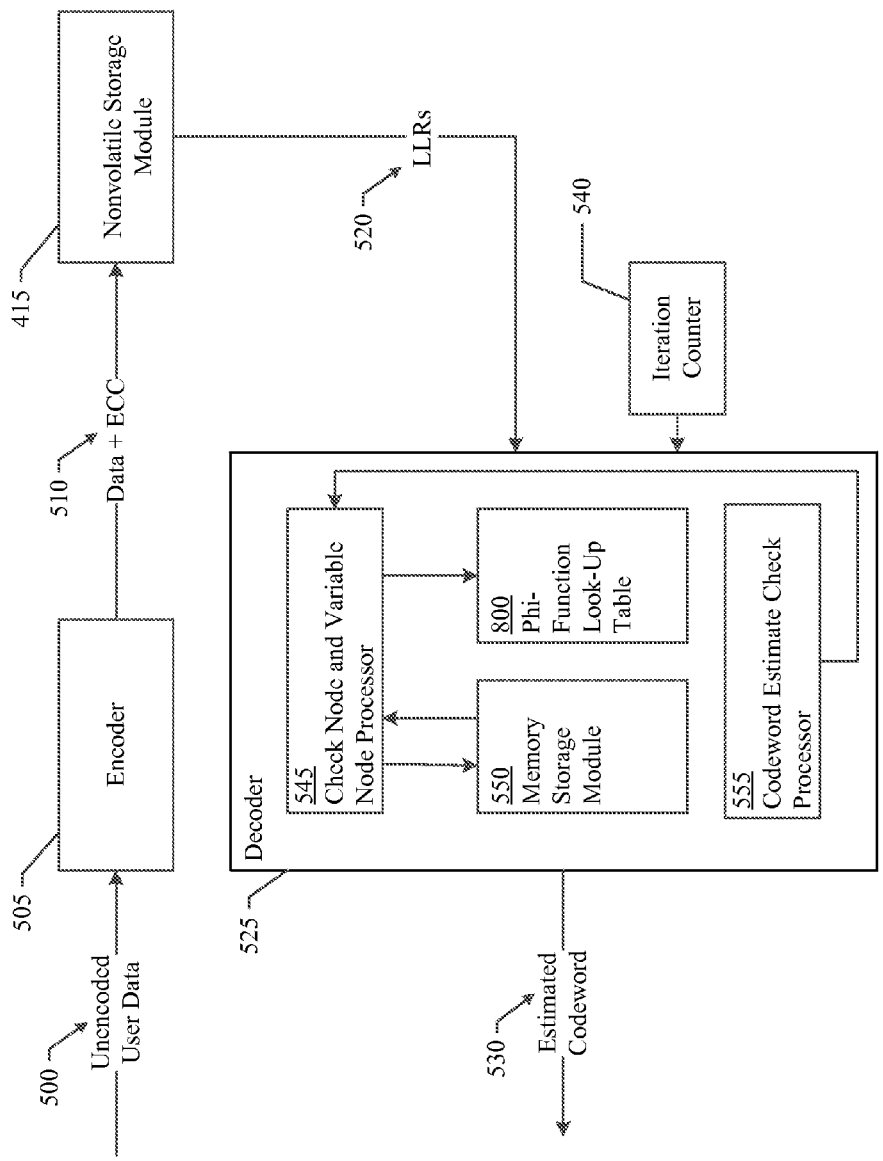
FIG. 8 is a block diagram illustrating LDPC encoding and sum-product LDPC decoding utilizing a phi-function look-up table in accordance with an embodiment of the present invention.

With reference to FIG. 8, in an additional embodiment of the present invention, a sum-product algorithm may be used to generate the common check node codeword estimate. In operation of the decoding processing utilizing the sum-product algorithm, during a read operation of the nonvolatile memory system 400, multiple reads of the stored codewords may be executed to provide soft information represented by LLRs 520 as previously described. The LLRs 520 are used as input to the LDPC decoder 525 and will be used to decode the unencoded user data 500 encoded by the LDPC encoder 505. The LLRs 520 received at the check node and variable node processor 545 of the LDPC decoder 525 are taken as the initial variable node codeword estimates for the first iteration of the decoding process. In the present invention, the check node processor and the variable node processor of the prior art are combined into a check node and variable node processor 545 to perform both the variable node processing and the check node processing of the decoder 525 in a single processor. In this embodiment, a phi-function look-up table 800 is coupled to the check node and variable node processor 545. The phi-function look-up table 800 is accessed during check node processing to generate the check node codeword estimates. A memory storage module 550 of the decoder is coupled to the check node and variable node processor 545 to allow variables to be stored and shared between the check nodes and the variable nodes of the check node and variable node processor 545. Typically, the decoder 525 will operate on a submatrix of the parity check matrix, thereby allowing the decoder 525 to perform decoding in parallel in order to improve the performance of the decoder. The submatrix comprises a subset of check node processors working with a subset of variable node processors. The subsets are changed during the decoding process such that the entire parity check matrix is covered by a submatrix. In the present invention, the check node processors and the variable node processors of a subset operate as a check node and variable node processor 545 to decode the encoded codeword.

Figure 9:
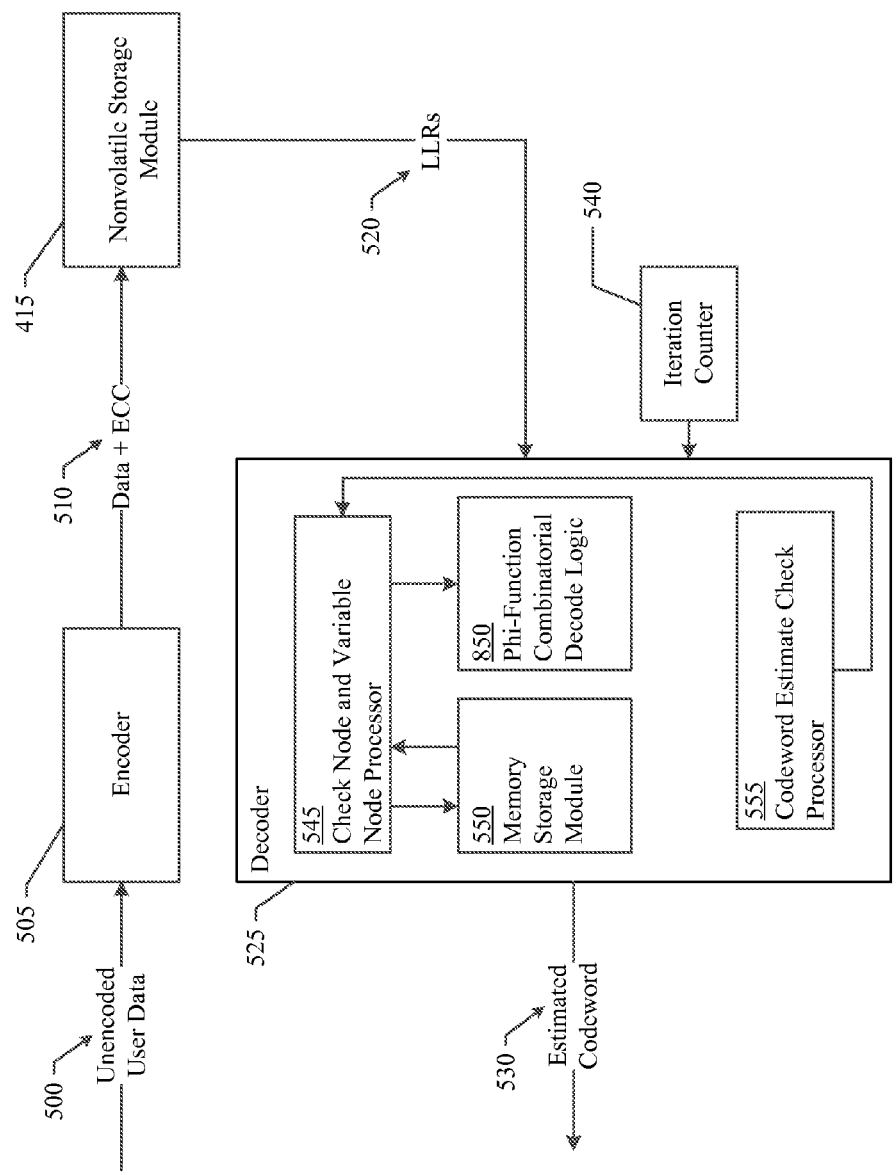
FIG. 9 is a block diagram illustrating LDPC encoding and sum-product LDPC decoding utilizing a phi-function combinatorial decode logic circuit in accordance with an embodiment of the present invention.

In an additional embodiment, shown with reference to FIG. 9, a phi-function combinatorial decode logic circuit 850 may be used in place of the phi-function look-up table 800 of FIG. 8 to generate the check node codeword estimate during check node processing utilizing the sum-product algorithm.

Figure 10:
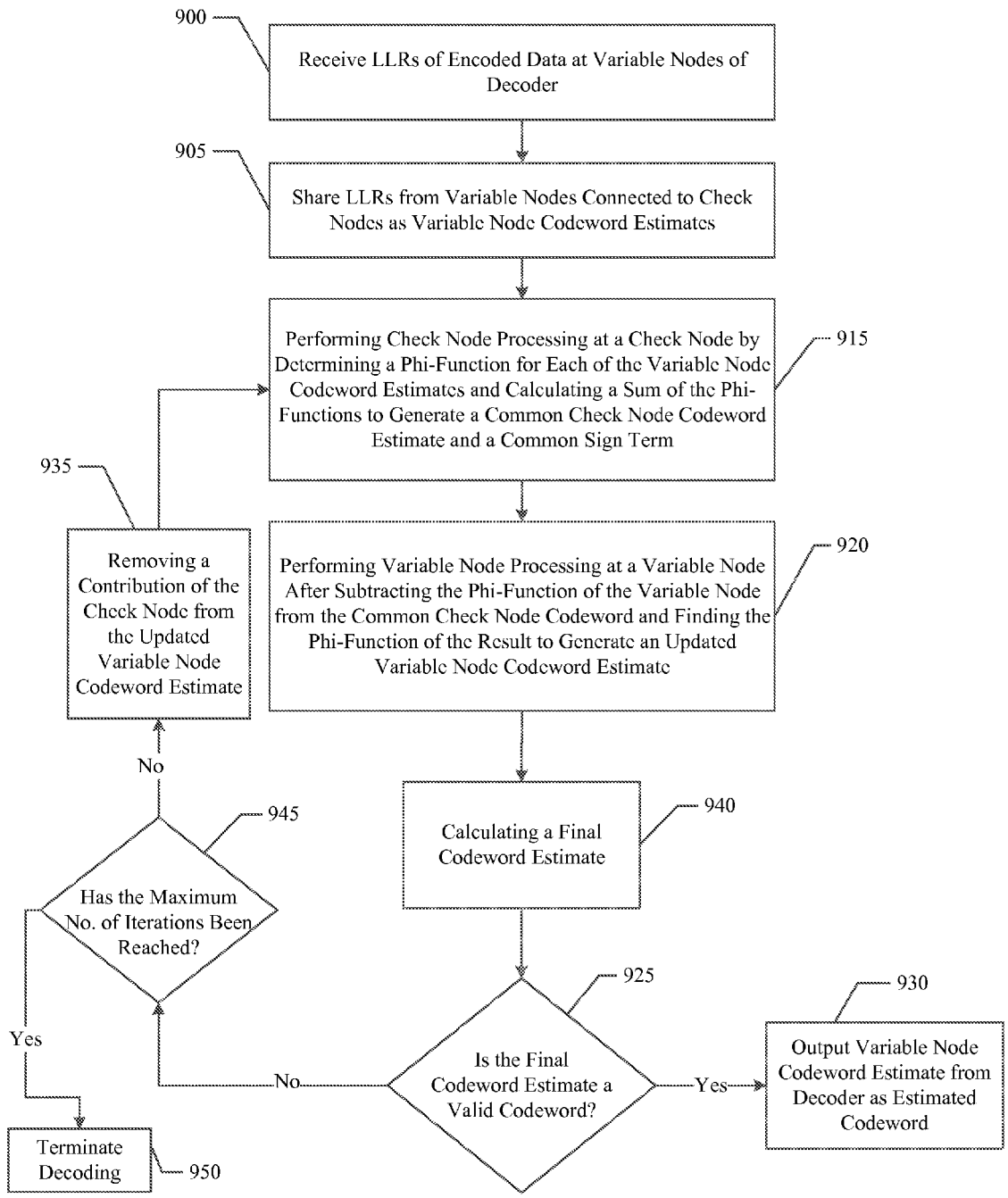
FIG. 10 is a flow diagram illustrating the sum-product LDPC decoding method in accordance with an embodiment of the present invention.

With reference to FIG. 10, in operation of the check node and variable node processor 545 in decoding a submatrix of the parity check matrix, to initiate the decoding processing utilizing the sum-product algorithm, the variable nodes of the check node of the check node and variable node processor 545 receives the LLRs of the encoded data 900 and shares the LLRs with the check nodes connected to the variable nodes as variable node codeword estimates 905. In a first iteration, the check node performs check node processing using the variable node codeword estimates from each of the variable nodes to which it is connected to generate a common check node codeword estimate. However, in generating the common check node codeword estimate for the sum-product decoding process, the check node determines a phi-function for each of the variable node codeword estimates received from each of the plurality of variable nodes and calculates a sum of the phi-functions for each of the variable node codeword estimates to generate the common check node codeword estimate 915. In one embodiment, the check node may determine the phi-function for each of the variable node codeword estimates by accessing the phi-function look-up table 800. In another embodiment, the check node may determine the phi-function for each of the variable node codeword estimates utilizing a phi-function combinatorial decode logic circuit 850. Because the sum-product equation for the check node also requires a sign term, the check node also calculates a common sign term calculated from the signs of the variable node codeword estimates received from each of the plurality of variable nodes connected to the check node. As such, in the sum-product case, the check node generates a common check node codeword estimate utilizing the phi-function and a common sign term 915 to be shared with the variable nodes to which the check node is connected.

When a particular variable node receives the common check node codeword estimate from the check node, the variable node must remove its contribution to the common check node codeword estimate prior to updating its codeword estimate. Knowing the variable node codeword estimate that the particular variable node originally sent to the check node, the variable node can determine the phi-function of the original variable node codeword estimate that it sent to the check node, and subtract it from the common check node codeword estimate. The variable node would then perform a phi-function look-up of the result of the subtraction to determine the phi-function which will be added to the original variable node codeword estimate to generate the updated variable node codeword estimate. In a specific embodiment, the subtraction may be combined with the phi-function and stored in a single phi-function look-up table. Before sharing the update variable node codeword estimate with the check nodes on the next iteration, the variable node must remove the contribution of the check node from the updated variable node codeword estimate 935.

In addition to identifying the phi-function of the variable node codeword estimates, the sum-product formula of the check node also calculates a sign term as the product of all the sign terms of the received variable node codeword estimates. In the present invention, the sign term is formed by a summation of the signs of all the received variable node codeword estimates, and as such is referred to as a common sign term. The check node also shares the common sign term with each of the variable nodes and the variable node must remove its contribution to the common sign term. The common sign term calculated by the check node will be negative is all the variable node codeword estimates had an odd number of negative numbers, otherwise the common sign term calculated by the check node will be positive. Each variable node will know the sign of the variable node codeword estimate that it sent to the check node, so the variable node can remove out its contribution to the common sign term by dividing the common sign term by the original sign term the variable node sent to the check node. For example, if the sign term of the variable node codeword estimate was negative, dividing the common sign term by the sign term of the variable node codeword estimate to remove the sign term of the variable node codeword estimate from the common sign term will invert the sign of the common sign term. Alternatively, if the common sign term is positive, dividing the common sign term by the sign term of the variable node codeword estimate to remove the sign term of the variable node codeword estimate from the common sign term will not change the sign of the common sign term.

After the variable node has removed its contribution to the common check node codeword estimate, by subtracting the appropriate phi-function and adjusting the common sign term, variable node processing is performed to generate an updated variable node codeword estimate 920. The updated variable node codeword estimated is generated by calculating the sum of the variable node codeword estimate previously sent to the check nodes and the phi-functions of the variable node codeword estimate from the connected check nodes. The updated variable node codeword estimate is then sent to the check nodes to which it is connected. A final codeword estimate is then calculated 940 which includes the common check node codeword estimates from all the check nodes connected to the variable node and the original LLR of the encoded data. The final codeword estimate is then checked by a codeword estimate check processor 555, to verify whether or not the final codeword estimate is a valid codeword 925. In a particular embodiment, the final codeword estimate may be multiplied by the parity check matrix to determine the syndrome and if the syndrome is zero, it may be determined that the final codeword estimate is a valid codeword. If the final codeword estimate is determined to be a valid codeword, the decoding is complete and the estimated codeword is provided as output 930 from the decoder 525. If it is determined by the codeword estimate check processor 555 that the final codeword estimate is not a valid codeword, and the maximum number of iterations of the decoding process has not been reached 945, a second iteration of the decoding begins. The check node processing 915 and variable node processing 920 will continue to be performed for each iteration until the final codeword estimate is determined to be a valid codeword or until a maximum number of iterations is reached 945. The iteration counter 540 may be used to track the number of iterations of the decoding process and may cause the decoding to terminate 950 if a maximum number of iterations is reached 945.

The present invention provides an iterative decoding method that eliminates the need to calculate customized check node codeword estimates by considering the check node processor and the variable node processor as a single processer having a shared memory for storing common variables to be used during both the check node processing and the variable node processing of the iterative decoding method. By reformulating the calculations performed during the check node processing and the variable node processing, the present invention also greatly reduces the number of common processing variables that need to be stored and shared between the variable and check nodes, thereby reducing the memory storage requirements for the LDPC iterative decoder.

In various embodiments, the system of the present invention may be implemented in a Field Programmable Gate Array (FPGA) or Application Specific Integrated Circuit (ASIC) suitable for the design of encoders/decoders for LDPC codes.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method for decoding low-density parity check (LDPC) encoded data using a parity check matrix, the parity check matrix to define the connections between a plurality of check nodes and a plurality of variable nodes, the method comprising:
performing, at a processor of a LDPC decoder, check node processing at one check node of the plurality of check nodes using a variable node codeword estimate received from each of the plurality of variable nodes connected to the check node to generate a common check node codeword estimate, and sharing the common check node codeword estimate with each of the plurality of variable nodes connected to the one check node;
performing, at the LDPC decoder, variable node processing at one variable node of the plurality of variable nodes after removing a contribution of the one variable node from the common check node codeword estimate to generate an updated variable node codeword estimate;
calculating, at the LDPC decoder, a final codeword estimate as the sum of each of the common check node codeword estimates received at the one variable node and the variable node codeword estimate;
performing, at the LDPC decoder, a check of the final codeword estimate to determine if the final codeword estimate is a valid codeword; and
if the final codeword estimate is not determined to be a valid codeword, removing a contribution of the one check node from the updated variable node codeword estimate and repeating the steps of performing check node processing and performing variable node processing until the final codeword estimate is determined to be a valid codeword or until a maximum number of iterations is reached.

2. The method of claim 1, further comprising:
receiving a plurality of log-likelihood ratios (LLRs) at each of the plurality of variable nodes of the decoder, each of the plurality of LLRs representing one of a plurality of bits of an LDPC codeword encoded using the parity check matrix; and
sharing the plurality of LLRs from each of the plurality of variable nodes with each of the connected check nodes as the variable node codeword estimates.

3. The method of claim 2, wherein receiving the plurality of LLRs further comprises receiving the plurality of LLRs from a nonvolatile memory storage module.

4. The method of claim 1, wherein performing check node processing further comprises performing check node processing using a min-sum decoding process.

5. The method of claim 4, wherein performing check node processing using a min-sum decoding process further comprises selecting the two most minimum magnitude variable node codeword estimates from the variable node codeword estimates received from each of the plurality of variable nodes to generate the common check node codeword estimate.

6. The method of claim 5, wherein performing variable node processing at the one variable node of the plurality of variable nodes after removing a contribution of the one variable node from the common check node codeword further comprises:
identifying the one of the two most minimum magnitude check node codeword estimates shared by the one check node that was contributed by the one variable node in the generation of the common check node codeword estimate; and
calculating a sum of the variable node codeword estimate of the one variable node and the identified one of the two most minimum magnitude check node codeword estimates shared by the one check node that was not contributed by the one variable node in the generation of the common check node codeword estimate from each of the plurality of check nodes connected to the one variable node to generate the updated variable node codeword estimate.

7. The method of claim 6, wherein removing a contribution of the one check node from the updated variable node codeword estimate if the final node codeword estimate is not determined to be a valid code word further comprises, subtracting the identified one of the two most minimum variable node codeword estimates from the updated variable node codeword estimate.

8. The method of claim 1, wherein the common check node codeword estimate comprises a common sign term calculated from the variable node codeword estimates received from each of the plurality of variable nodes connected to the one check node, and wherein removing the contribution of the one variable node from the common check node codeword estimate further comprises removing the contribution of the one variable node from the common sign term of the common check node codeword estimate.

9. The method of claim 1, wherein performing check node processing further comprises performing check node processing using a sum-product decoding process.

10. The method of claim 9, wherein performing check node processing using a sum-product decoding process further comprises:
   determining a phi-function for each of the variable node codeword estimates received from each of the plurality of variable nodes; and
   calculating a sum of the phi-functions for each of the variable node codeword estimates to generate the common check node codeword estimate.

11. The method of claim 10, wherein determining a phi-function for each of the variable node codeword estimates further comprises accessing a phi-function look-up table to determine the phi-function.

12. The method of claim 10, wherein determining a phi-function for each of the variable node codeword estimates further comprises performing a phi-function combinatorial decode to determine the phi-function.

13. The method of claim 10, wherein performing variable node processing at the one variable node of the plurality of variable nodes after removing a contribution of the one variable node from the common check node codeword further comprises:
   determining a phi-function of the variable node codeword estimate of the one variable node;
   subtracting the phi-function of the variable node codeword estimate of the one variable node from the common check node codeword estimate; and
   calculating a sum of the variable node codeword estimate of the one variable node and the result of the subtraction.

14. The method of claim 13, wherein determining the phi-function of the one variable node codeword estimate further comprises accessing a phi-function look-up table to determine the phi-function.

15. The method of claim 13, wherein determining the phi-function of the one variable node codeword estimate further comprises accessing a phi-function lookup table comprising entries for the sum of the variable node codeword estimates of the one variable node and the result of the subtraction.

16. The method of claim 13, wherein determining the phi-function of the one variable node codeword estimate further comprises performing a phi-function combinatorial decode to determine the phi-function.

17. An LDPC decoder for decoding low-density parity check (LDPC) encoded data, the LDPC encoded data comprising a plurality of log-likelihood ratios (LLRs), each of the plurality of LLRs representing one of a plurality of bits of an LDPC codeword encoded using a parity check matrix, the decoder comprising:
   a check node and variable node processor for performing check node processing at one check node of the plurality of check nodes using a variable node codeword estimate received from each of the plurality of variable nodes connected to the check node to generate a common check node codeword estimate, for sharing the common check node codeword estimate with each of the plurality of variable nodes connected to the one check node, for performing variable node processing at one variable node of the plurality of variable nodes after removing a contribution of the one variable node from the common check node codeword estimate to generate an updated variable node codeword estimate, and for calculating a final codeword estimate;
   a codeword estimate check processor coupled to the check node and variable node processor, the codeword estimate check processor for performing a check of the final codeword estimate to determine if the final codeword estimate is a valid codeword; and
   wherein the check node and variable node processor is configured for removing a contribution of the one check node from the updated variable node codeword estimate if the final codeword estimate is not determined to be a valid codeword, and for repeating the check node processing and variable node processing until the final codeword estimate is determined to be a valid codeword or until a maximum number of iterations is reached.

18. The decoder of claim 17, further comprising an iteration counter coupled to the codeword estimate check processor, the iteration counter to determine if the maximum number of iterations of the iterative decoding is reached.

19. The decoder of claim 17, further comprising a phi-function look-up table coupled to the check node and variable node processor.

20. The decoder of claim 17, further comprising a phi-function combinatorial decode logic circuit coupled to the check node and variable node processor.

21. An LDPC decoder for decoding low-density parity check (LDPC) encoded data, the LDPC encoded data comprising a plurality of log-likelihood ratios (LLRs), each of the plurality of LLRs representing one of a plurality of bits of an LDPC codeword encoded using a parity check matrix, the decoder comprising:
   a check node and variable node processor for performing check node processing at one check node of the plurality of check nodes using a sum-product decode process and a variable node codeword estimate received from each of the plurality of variable nodes connected to the check node to generate a common check node codeword estimate, for sharing the common check node codeword estimate with each of the plurality of variable nodes connected to the one check node, for performing variable node processing at one variable node of the plurality of variable nodes using sum-product decode processing after removing a contribution of the one variable node from the common check node codeword estimate to generate an updated variable node codeword estimate and for calculating a final codeword estimate;
   a codeword estimate check processor coupled to the check node and variable node processor, the codeword estimate check processor for performing a check of the final codeword estimate to determine if the final codeword estimate is a valid codeword; and
   wherein the check node and variable node processor is configured for removing a contribution of the one check node from the updated variable node codeword estimate if the final codeword estimate is not determined to be a valid codeword, and for repeating the check node processing and variable node processing until the final codeword estimate is determined to be a valid codeword or until a maximum number of iterations is reached.

* * * * *